(12) United States Patent
Jong et al.

(10) Patent No.: US 8,829,940 B2
(45) Date of Patent: Sep. 9, 2014

(54) METHOD FOR TESTING A PARTIALLY ASSEMBLED MULTI-DIE DEVICE, INTEGRATED CIRCUIT DIE AND MULTI-DIE DEVICE

(75) Inventors: Fransciscus Geradus Marie de Jong, Valkenswaard (NL); Alexander Sebastian Biewenga, Eindhoven (NL)

(73) Assignee: NXP, B.V., Eindhoven (NL)

( * ) Notice: Subject to any disclaimer, the term of this patent is extended or adjusted under 35 U.S.C. 154(b) by 834 days.

(21) Appl. No.: 13/120,793

(22) PCT Filed: Sep. 26, 2009

(86) PCT No.: PCT/IB2009/054219
§ 371 (c)(1),
(2), (4) Date: May 19, 2011

(87) PCT Pub. No.: WO2010/035238
PCT Pub. Date: Apr. 1, 2010

(65) Prior Publication Data
US 2012/0126846 A1 May 24, 2012

(30) Foreign Application Priority Data

Sep. 26, 2008 (EP) .................................... 08165280

(51) Int. Cl.
*G01R 31/02* (2006.01)
*G01R 31/26* (2014.01)
*G01R 31/3185* (2006.01)
G01R 31/317 (2006.01)
G01R 31/319 (2006.01)
G01R 31/28 (2006.01)
G01R 31/3183 (2006.01)
G01R 19/00 (2006.01)

(52) U.S. Cl.
CPC .. *G01R 31/318555* (2013.01); G01R 31/31717 (2013.01); *G01R 31/3185* (2013.01); G01R 31/31924 (2013.01); G01R 31/28 (2013.01); G01R 31/26 (2013.01); G01R 31/3183 (2013.01); G01R 19/00 (2013.01); *G01R 31/318558* (2013.01)
USPC .............. 324/762.03; 324/750.3; 324/757.04; 324/762.02; 324/76.11; 324/73.1; 714/733; 714/734; 257/48

(58) Field of Classification Search
CPC ............... G01R 31/3185; G01R 31/28; G01R 31/3183; G01R 31/26; G01R 31/31924; G01R 31/31855; G01R 19/00
USPC ............... 324/750.3, 762.03, 757.04, 762.02, 324/76.11, 73.1; 714/733, 734; 257/48
See application file for complete search history.

(56) References Cited

U.S. PATENT DOCUMENTS

| | | | |
|---|---|---|---|
| 4,862,072 A * | 8/1989 | Harris et al. .................. 324/73.1 |
| 5,109,190 A * | 4/1992 | Sakashita et al. ............. 714/727 |
| 5,155,732 A * | 10/1992 | Jarwala et al. ................ 714/726 |
| 5,563,524 A * | 10/1996 | Ungar ........................ 324/750.3 |
| 5,568,493 A * | 10/1996 | Morris ........................ 714/726 |
| 5,602,855 A * | 2/1997 | Whetsel, Jr. .................. 714/727 |
| 5,680,407 A * | 10/1997 | De Jong ....................... 714/727 |
| 6,108,805 A | 8/2000 | Rajsuman |
| 6,483,758 B1 * | 11/2002 | Kim et al. ..................... 365/201 |
| 6,622,108 B1 * | 9/2003 | De Jong et al. .............. 702/118 |
| 6,653,957 B1 * | 11/2003 | Patterson et al. ............. 341/100 |
| 6,671,839 B1 * | 12/2003 | Cote et al. .................... 714/726 |
| 6,686,759 B1 * | 2/2004 | Swamy .................... 324/750.15 |
| 6,717,429 B2 * | 4/2004 | Whetsel ....................... 324/750.3 |
| 6,912,681 B1 * | 6/2005 | Schoeber ...................... 714/738 |
| 6,917,215 B2 * | 7/2005 | Ichikawa .................... 324/750.3 |
| 6,987,382 B1 * | 1/2006 | Whetsel ...................... 324/750.3 |
| 7,010,722 B2 * | 3/2006 | Jahnke ......................... 714/30 |
| 7,047,458 B2 * | 5/2006 | Nejedlo et al. ................ 714/715 |
| 7,213,183 B2 * | 5/2007 | Gossmann ..................... 714/724 |
| 7,295,028 B2 * | 11/2007 | Ichikawa .................... 324/750.3 |
| 7,352,169 B2 * | 4/2008 | Abraham et al. ......... 324/762.02 |
| 7,640,468 B2 * | 12/2009 | Linam et al. .................. 714/724 |
| 7,917,819 B2 | 3/2011 | Talayssat et al. |
| 2002/0040458 A1 | 4/2002 | Dervisoglu et al. |
| 2002/0145441 A1 * | 10/2002 | Shiraishi ....................... 324/765 |
| 2002/0147950 A1 * | 10/2002 | Whetsel ....................... 714/726 |
| 2002/0157052 A1 * | 10/2002 | Ernst et al. .................... 714/738 |
| 2006/0123305 A1 * | 6/2006 | Linam et al. .................. 714/744 |

| | | | |
|---|---|---|---|
| 2006/0232292 | A1* | 10/2006 | Shimizume et al. ............ 324/765 |
| 2007/0028815 | A1 | 2/2007 | Sommerfield |
| 2007/0089003 | A1* | 4/2007 | Whetsel ......................... 714/726 |
| 2007/0118782 | A1* | 5/2007 | Whetsel ......................... 714/729 |
| 2007/0150780 | A1* | 6/2007 | Shimooka ...................... 714/726 |
| 2007/0165472 | A1* | 7/2007 | Zerbe et al. .................... 365/201 |
| 2007/0168803 | A1* | 7/2007 | Wang et al. .................... 714/726 |
| 2008/0005634 | A1 | 1/2008 | Grise et al. |
| 2008/0106287 | A1* | 5/2008 | Whetsel et al. ................ 324/754 |
| 2008/0250289 | A1* | 10/2008 | Gloekler et al. ............... 714/733 |
| 2008/0281547 | A1* | 11/2008 | Nakamura et al. ............. 702/120 |
| 2009/0077438 | A1* | 3/2009 | Schuttert et al. ............... 714/727 |
| 2009/0079440 | A1* | 3/2009 | Williamson et al. ........... 324/612 |
| 2009/0265591 | A1* | 10/2009 | Okukawa et al. .............. 714/718 |
| 2009/0274051 | A1* | 11/2009 | Boswell et al. ................ 370/241 |
| 2010/0031102 | A1* | 2/2010 | Whetsel ......................... 714/727 |
| 2010/0052736 | A1* | 3/2010 | Watanabe et al. .............. 327/107 |
| 2010/0095177 | A1* | 4/2010 | Forlenza et al. ............... 714/731 |
| 2010/0244848 | A1* | 9/2010 | Barrenscheen et al. ....... 324/500 |
| 2011/0087941 | A1* | 4/2011 | Whetsel ......................... 714/733 |
| 2011/0145667 | A1* | 6/2011 | Whetsel ......................... 714/731 |
| 2011/0267093 | A1 | 11/2011 | de Jong et al. |
| 2012/0147986 | A1* | 6/2012 | Zerbe et al. .................... 375/295 |
| 2012/0159275 | A1* | 6/2012 | Whetsel ......................... 714/733 |
| 2012/0179945 | A1* | 7/2012 | Whetsel ......................... 714/731 |

FOREIGN PATENT DOCUMENTS

| | | |
|---|---|---|
| CN | 1472932 A | 2/2004 |
| CN | 1910464 A | 2/2007 |
| CN | 101059546 A | 10/2007 |
| CN | 101097245 A | 1/2008 |
| CN | 101228451 A1 | 7/2008 |
| WO | WO3096038 * | 11/2003 |
| WO | WO2004057357 * | 7/2004 |
| WO | WO2004005949 * | 11/2004 |
| WO | WO2005003896 * | 11/2005 |
| WO | 2007/010480 A2 | 1/2007 |
| WO | 2007/010493 A2 | 1/2007 |
| WO | WO2007042622 * | 4/2007 |

OTHER PUBLICATIONS

International Search Report and Written Opinion for Application PCT/IB2009/054219 (Dec. 17, 2009).

* cited by examiner

*Primary Examiner* — Patrick Assouad
*Assistant Examiner* — Lamarr Brown

(57) ABSTRACT

The present invention discloses a method of testing a partially assembled multi-die device (1) by providing a carrier (300) comprising a device-level test data input (12) and a device-level test data output (18); placing a first die on the carrier, the first die having a test access port (100c) comprising a primary test data input (142), a secondary test data input (144) and a test data output (152), the test access port being controlled by a test access port controller (110); communicatively coupling the secondary test data input (144) of the first die to the device-level test data input (12), and the test data output (152) of the first die to the device-level test data output (18); providing the first die with configuration information to bring the first die in a state in which the first die accepts test instructions from its secondary test data input (144); testing the first die, said testing including providing the secondary test data input (144) of the first die with test instructions through the device-level test data input (12); and collecting a test result for the first die on the device-level test data output (18). Consequently, a die of a partially assembled multi-die device such as a System-in-Package may be tested using its integrated boundary scan test architecture.

15 Claims, 5 Drawing Sheets

Figure 1:
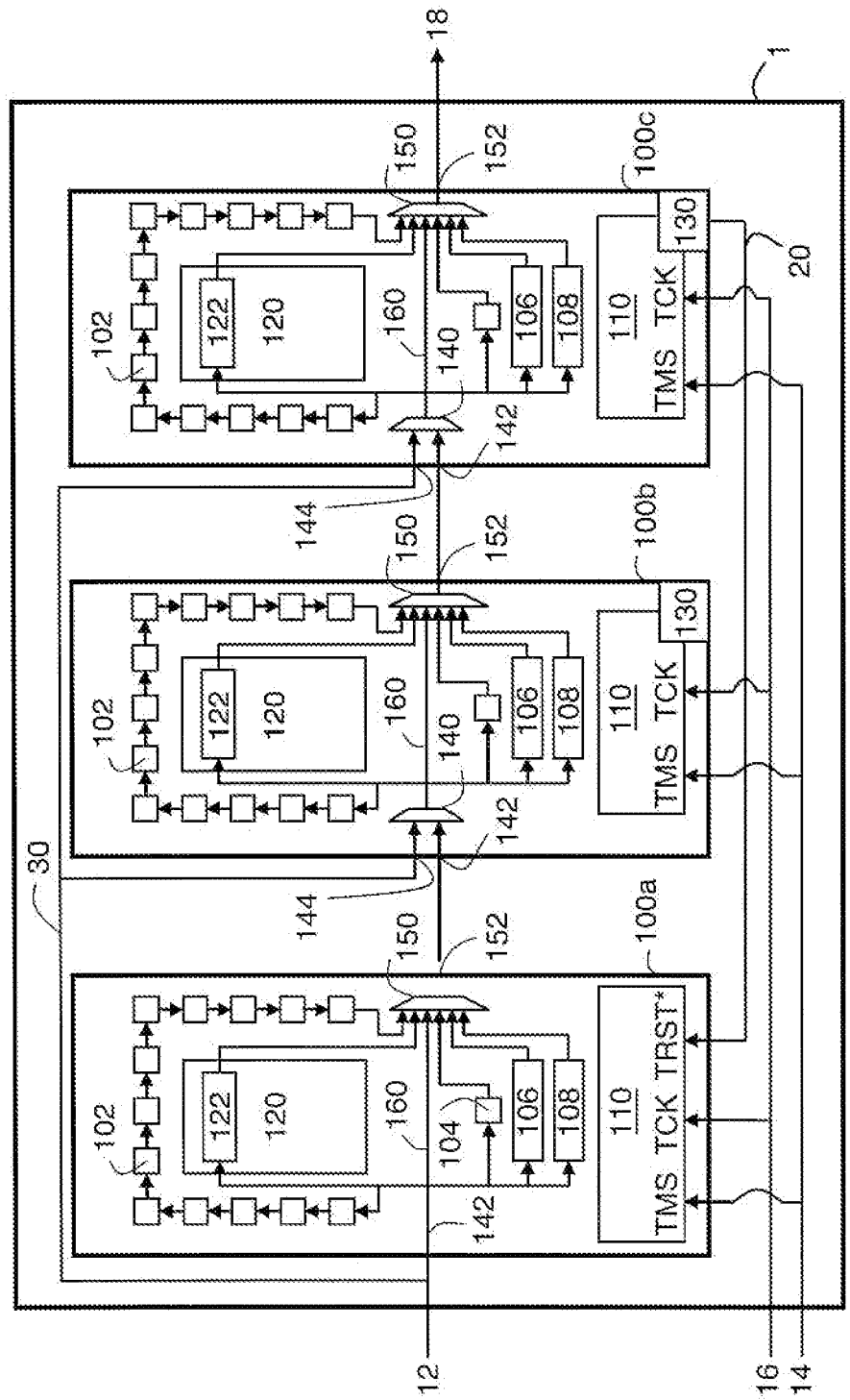

METHOD FOR TESTING A PARTIALLY ASSEMBLED MULTI-DIE DEVICE, INTEGRATED CIRCUIT DIE AND MULTI-DIE DEVICE

The present invention relates to a method for testing a partially assembled multi-die device such as a partially assembled System-in-Package (SiP).

The present invention further relates to an integrated circuit (IC) die for use in such a method.

The present invention yet further relates to a multi-die device comprising at least one of such an IC die.

Due to the ongoing evolution of semiconductor markets and technologies, new semiconductor products emerge in the market on a regular basis.

An example of such a product gaining commercial interest is a so-called system-in-package (SiP), in which a number of separate semiconductor dies, e.g. integrated circuits (ICs), are mounted on a (passive) substrate, and enclosed in a single package. Consequently, a device is obtained that has the look and feel of a single device, in contrast to for instance a printed circuit board (PCB), where the various different dies on the PCB are easily recognizable and accessible.

Typically, any semiconductor product needs to be tested before being released into the market. Several standardized test solutions exist; for instance, the IEEE 1149.1 standard, also known as boundary scan test (BST) or JTAG test, facilitates the testing of interconnects of the separate ICs on a PCB, as originally intended. In addition, IEEE 1149.1 is now also used to test interconnects of ICs in isolation and to feed test data into the internal logic of an IC using the IEEE 1149.1 boundary scan chain.

According to BST, an IC is extended with a test access port (TAP) under control of a TAP controller. The TAP comprises a plurality of shift registers such as an external test or boundary scan register, a bypass register and an instruction register coupled between a test data input (TDI) and a test data output (TDO), with the TAP controller being in charge of selecting the appropriate register in response to an instruction loaded into the instruction register via TDI. Optionally, the TAP controller is further responsive to a test reset (TRST) signal to ensure that the test arrangement is in a well-defined state at the beginning of testing the IC.

In order to comply with the BST standard, a number of design rules have to be observed for the test arrangement inside an IC. For instance, a JTAG device may have only a single TAP, and must have a bypass register consisting of a single cell, i.e. data storage element such as a latch or a flipflop, length. Moreover, if the optional identification register is present in the TAP, this register should have a fixed length of 32 cells. These design rules pose complications for devices in which more than one IC are present, such as a SiP. In a SiP, a number of different IC dies are present, which typically are mounted on a passive substrate before the aggregate is concealed in a single package. Because each IC die may come from a different source, each die may have its own independent test arrangement. These test arrangements may comply with the JTAG constraints on an individual basis, but in cooperation, the aggregate of test arrangements is likely to breach the aforementioned JTAG compliancy rules, because the SiP is seen as a single JTAG device. For instance, the test path through the various test arrangements leads to a multitude of TAPs having an aggregate bypass register length of more than a single cell, breaching the BST compliancy rules for a single JTAG device.

PCT patent application WO 2007/010493 discloses a multiple die arrangement such as a SiP that can be tested in compliance with the BST standard. The arrangement provides a bypass from the module TDI pin to an additional test data input of the TAP of the dies in a daisy chain of dies. Such a test arrangement facilitates JTAG compliant testing of a SiP by providing a direct connection between the SiP module TDI pin and such an additional test data input, thus facilitating the bypassing of preceding dies and associated test arrangements of the SiP. This arrangement focuses on testing a completed modular device such as a SiP to assess whether the device operates within predefined parameters.

There is also a need to test modular devices such as a SiP at intermediates stages of their manufacturing. This is because the yield of a SiP manufacturing process is typically lower than the yield of a single-die manufacturing process, e.g. SoC manufacturing, and once the multiple dies of the SiP are integrated into the single package, repairs to the SiP to correct flaws detected during test are difficult to make. Consequently, if a modular device such as a SiP is tested after completion of its manufacture, the faulty device is usually discarded, which has a detrimental effect on the price of the known good devices because the relatively low yield of the manufacturing process drives up the price of the devices that pass the testing stage. Unfortunately, the test arrangement disclosed in WO2007/010493 does not facilitate testing of a partially assembled SiP.

PCT patent application WO 2007/010480 discloses a SiP which has a wireless test controller for testing each die after it has been mounted onto the substrate of the system in package. A faulty die may be repaired or replaced before a next die is mounted onto the substrate. This way, the system in package can be tested during the intermediate stages of its manufacturing, thus ensuring that all dies function correctly before sealing the dies in the single package. Although this arrangement significantly improves the yield of the SiP manufacturing process, it has the drawback that the completed device has limited test flexibility because only a device level test controller is available.

The present invention seeks to provide a method for testing a multi-die package such as a SiP during its intermediate manufacturing stages that improves the test flexibility of a completed package.

The present invention seeks to provide an IC die that can be tested in accordance with this method.

According to a first aspect of the invention, there is provided a method of testing a partially assembled multi-die device, comprising providing a carrier comprising a device-level test data input and a device-level test data output; placing a first die on the carrier, the first die having a test access port comprising a primary test data input (TDI), a secondary test data input (STDI) and a test data output (TDO); communicatively coupling STDI of the first die to the device-level TDI, and the TDO of the first die to the device-level TDO; bringing the first die in a state in which the first die accepts test instructions from its STDI; providing test data to the first die, including providing the STDI of the first die with test instructions through the device-level TDI; and collecting a test result from the first die on the device-level TDO.

The present invention makes it possible to feed test instructions into a die placed on a carrier of a multi-die device such as a SiP. To this end, the carrier comprises a conductor connected to its device-level test data input, which is arranged such that the STDI of every newly placed die can be connected to this conductor, as for instance is also shown in WO2007/010493. However, in contrast with the dies of this prior art device, the dies used in the test method of the present invention allow the insertion of an instruction via the STDI.

It is important to realize that in order for a TAP controller to operate in compliance with the IEEE 1149.1 standard, instructions to be received by the instruction register must at all time be received through the primary test data input, i.e. the TDI pin of the TAP. This makes it impossible to use the test arrangement disclosed in WO2007/010493 for partial assembly testing because the state machines of the TAP controllers of the dies used in the SiP disclosed therein are JTAG-compliant, i.e. the TAP cannot be configured to receive instructions via the STDI pin. Although WO2007/010493 discloses the use of a second category of instructions that use the STDI, it is important to understand that this use of the STDI relates to the shifting in of data under control of such an instruction. The instruction itself always has to be shifted in via the primary, i.e. mandatory, test data input TDI.

To this end, the dies used in the present invention have a modified TAP controller. Typically, the TAP controller has a state machine which controls the access to the die via the TAP. The JTAG-compliant state machine has two main branches; a first branch for inserting instructions into the TAP and a second branch for inserting data into the TAP. In accordance with the present invention, the state machine of TAP controller of the dies is modified to accept instructions via the STDI under well-defined conditions.

In an embodiment, the first die comprises a data register such as the identification register or the bypass register coupled between its STDI and its TDO and comparison logic coupled to the data register, and the step of bringing the first die in a state in which the first die accepts test instructions from its STDI comprises resetting the TAP controller of the first die such that the data register is coupled to the STDI; shifting the configuration information into the data register via the device-level TDI; comparing the provided configuration information with an identification code stored in the first die; and enabling the TAP to receive instructions via the STDI in case of a match between the configuration information and the identification code.

Upon reset, the TAP controller of the first die couples the data register in the TAP to the STDI. This facilitates the detection of dedicated configuration information such as a code word in the data register, which subsequently triggers the TAP controller to allow instructions to be inserted via the STDI. In other words, the configuration information notifies the TAP controller that a partial assembly test is to be performed.

In an alternative embodiment, the test access port comprises a test input selection pin, the method further comprising connecting the test input selection pin to a carrier-level configuration input and wherein the step of bringing the first die into said state comprises providing the test input selection pin with a secondary test input selection signal. Since the addition of a pin to the total pin count adds to the cost of the device to be manufactured, this embodiment is particularly advantageous for dies in which pin count is not a cost-crucial factor. This embodiment does provide a straightforward test data input selection mechanism that requires little design for testability (DfT) hardware on the die.

In a preferred embodiment, the primary test data input pin is connected to a weak fixed binary value source such as a pull-up (or pull-down) transistor, and the first die comprises a detector for detecting the binary complement, e.g. a low voltage in case of a pull-up transistor, on the primary test data input, and wherein the step of bringing the first die into said state comprising selecting the secondary test data input in response to the detector signaling the absence of the binary complement on the primary test data input.

This embodiment is based on the realization that any IEEE 1149.1 compliant manufacturer's ID code must comprise at least one '0' bit, which is represented as a low voltage on the primary test data input. Such a low voltage state can only be reached if the primary test data input is driven by a connection, i.e. a test data output of a preceding die in the daisy chain, such that the weak pull-up voltage source is overpowered. Hence, failure to detect such a low voltage state on the primary test data input of the first die signals the absence of a connection to the primary test data input, which subsequently triggers the state machine to accept test instructions via the secondary test data input.

This embodiment is particularly advantageous for intermediate testing during the manufacture of multi-die devices comprising multiple instances of the same die, where identification information fed into respective dies via their respective STDI pins would cause the unwanted STDI-enabled instruction reception by multiple (identical) dies at the same time.

Advantageously, the method further comprises placing an additional die on the carrier, the additional die having a test access port comprising a primary test data input (TDI), a secondary test data input (STDI) and a test data output (TDO); communicatively coupling the STDI of the additional die to the device-level TDI, and the TDO of the additional die to the TDI of the first die; providing the additional die with configuration information to bring the additional die in a state in which the additional die accepts test instructions from its STDI; testing the additional die, said testing including providing the STDI of the additional die with test instructions; and collecting a test result for the additional die on the device-level TDO via any previously placed dies.

The above procedure is typically repeated for every next die to be placed onto the carrier, with the test result being provided on the device-level test data output via the daisy chain formed by the dies placed on the carrier.

The method may be completed by placing a final die on the carrier, the final die having a TAP comprising a primary test data input (TDI) and a test data output (TDO); communicatively coupling the TDI of the final die to the device-level test data input, and the TDO of the additional die to the TDI of the previously placed additional die; testing the final die, said testing including providing the TDI of the final die with test instructions; and collecting a test result for the final die on the device-level TDO via the daisy chain formed by the previously placed dies.

This yields a completed device that is substantially similar to the device disclosed in WO2007/010493, with the difference that the dies in the multi-die device of the present invention have modified TAP controllers to facilitate partial assembly testing, and include detection means for detecting a precondition for receiving instructions via the secondary test data input, such as a detector for detecting a low voltage on the primary data input, decoding logic coupled to a data register of the TAP for detecting a match between a received data pattern and an encoded identifier, or a test data input selection pin. The partial assembly testing makes it possible to abort the device assembly process as soon as a faulty die is detected, thus avoiding wasting further assembly steps and facilitating repairing the faulty die before the multi-die device is packaged.

In addition, this arrangement facilitates testing of individual dies in case of a break in the daisy chain, because each die can always be accessed via its STDI, and brought into a state where test instructions can be loaded into the die via this input. This increases the amount of diagnostic information that can be retrieved, and may lead to the determination of the cause or location of the break in the daisy chain.

Usually, there is data available that is indicative of an expected yield, or failure rate, of a die to be placed onto the carrier. The respective data for each die can be used to define an assembly strategy into which dies are placed onto carrier in an order of increasing yield expectation or decreasing failure rate expectation. In other words, dies that are more likely to fail are placed onto the carrier early in the assembly process, i.e. towards the end of the daisy chain, such that likely failures are caught early, thus limiting the assembly efforts and costs.

Alternatively, the dies may be mounted onto the carrier in order of increasing cost such that if a partial assembly has to be discarded only relatively cheap dies are lost. Typically, a routing plan will be drawn up for interconnecting the dies after the assembly order has been determined. The routing is preferably placed on the carrier prior to the placement of the dies to reduce the amount of processing of the carrier after placement of the dies, since processing steps following placement of the dies introduce a risk of damage to the dies.

According to another aspect of the present invention, there is provided an integrated circuit die comprising a test arrangement, the test arrangement comprising a TAP comprising a primary test data input (TDI), a secondary test data input (STDI) and a test data output (TDO); a multiplexer having respective inputs coupled to the TDI and the STDI; a plurality of registers including an identification register and an instruction register, said plurality of registers being coupled between the multiplexer and the TDO; detection means for detecting a precondition for receiving instructions via the secondary test data input; and a TAP controller for coupling the instruction register to the STDI in response to the detection means.

As previously explained, such a die allows instructions to be shifted into the instruction register via the STDI pin, thereby facilitating partially assembled multi-die devices to be tested.

In an embodiment, the instruction register comprises a register cell for storing a bit flag indicating the selection of the TDI or STDI as input, the multiplexer being responsive to the bit flag. This allows instructions to select whether data should be shifted in via the primary or secondary test data input. For instance, an instruction such as the EXTEST instruction may comprise an additional bit indicating the data to be shifted into the boundary scan chain via the primary or secondary test data input. In other words, this embodiment adds an input toggle bit to the same instruction, e.g. 0010-0 and 0010-1. Alternatively, the instruction itself may be changed to invoke the selection of the respective inputs, in which case no additional bit is required but the instruction decoding logic has to be modified.

Figure 2:
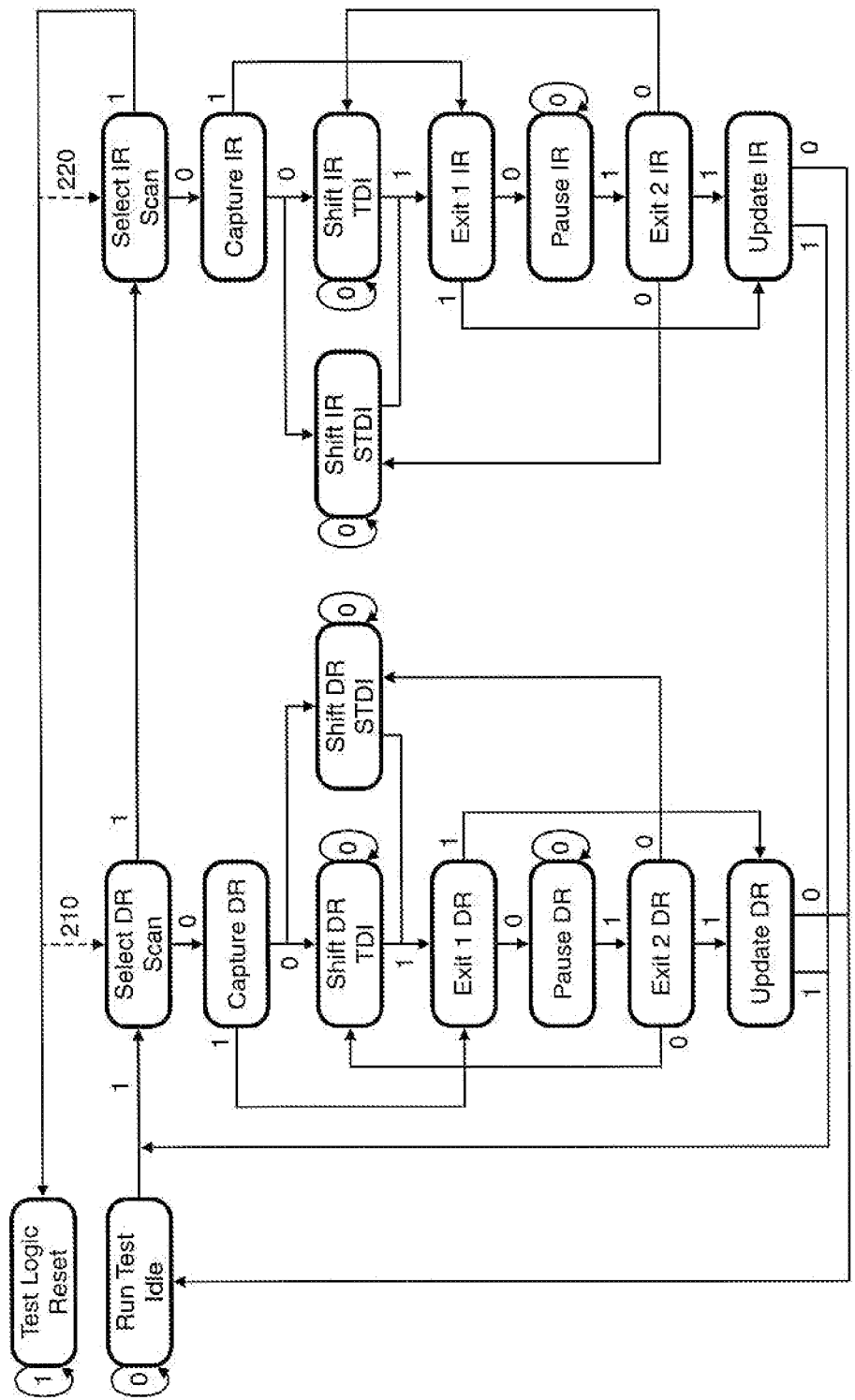
Figure 3A:
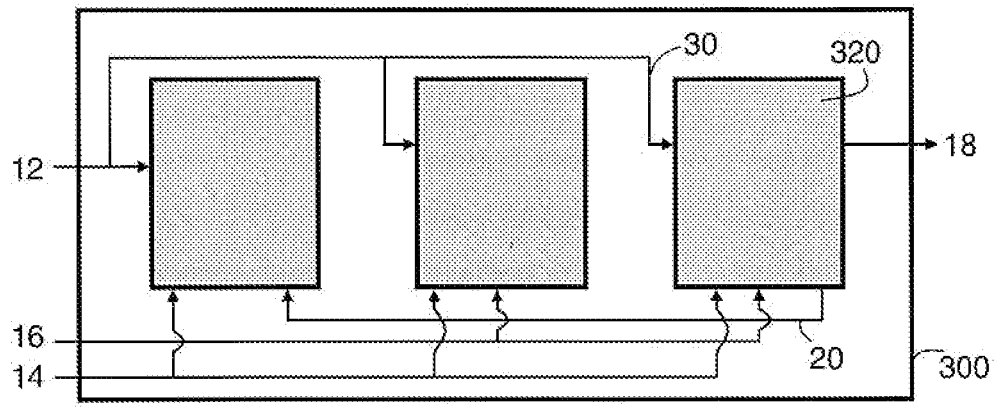
Figure 3B:
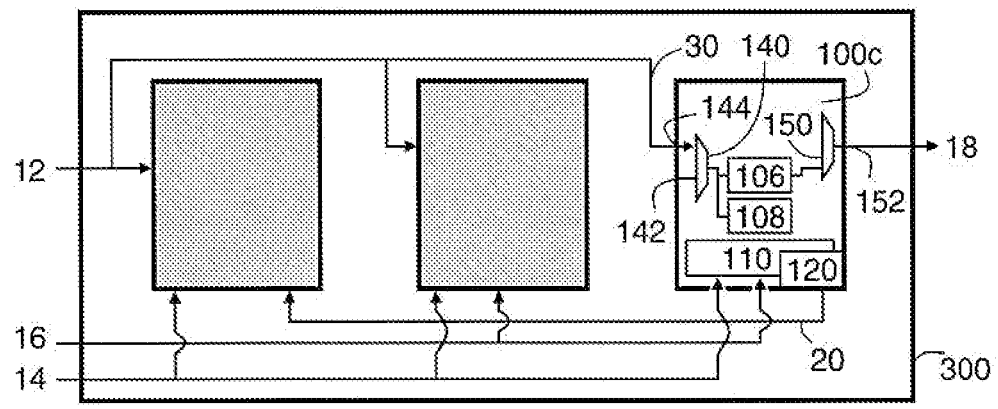
Figure 3C:
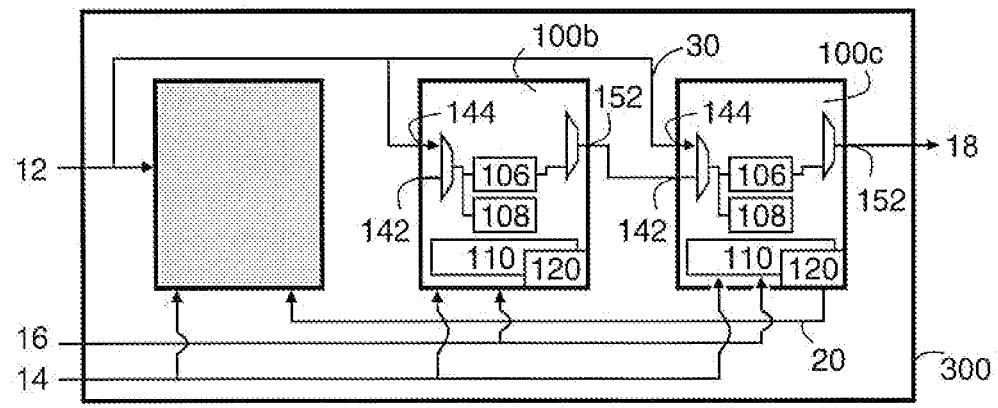
Figure 4:
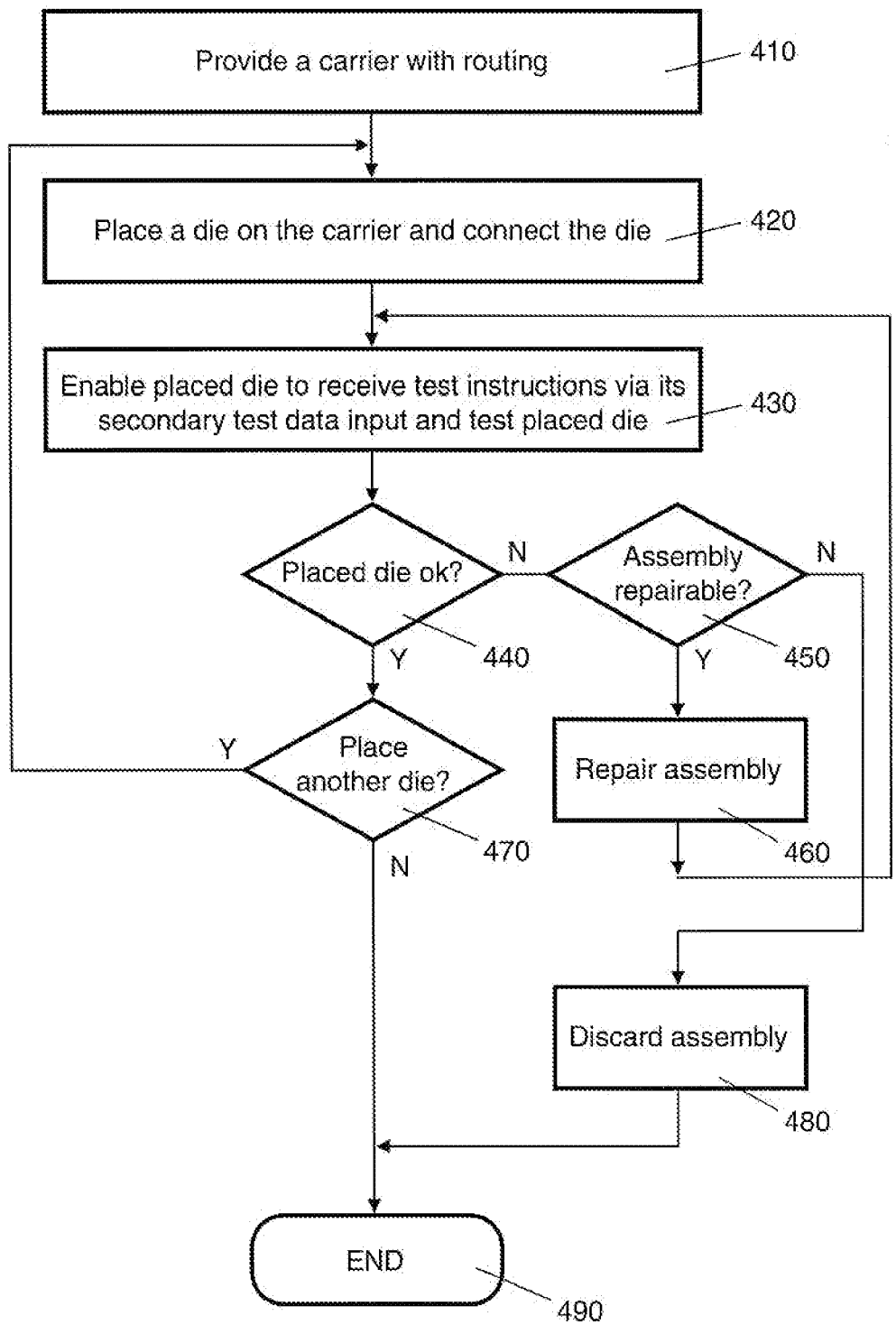
Figure 5:
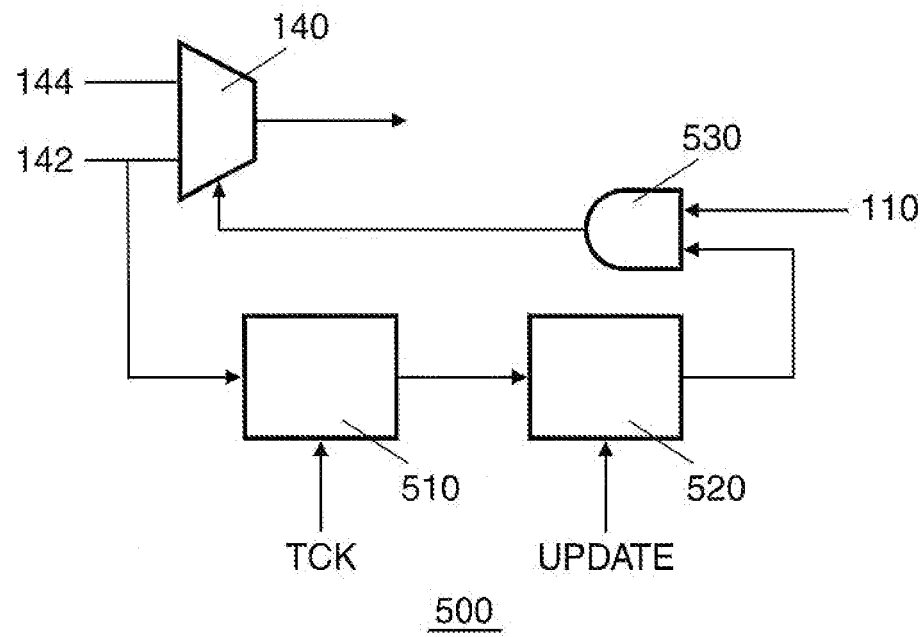
Figure 6:
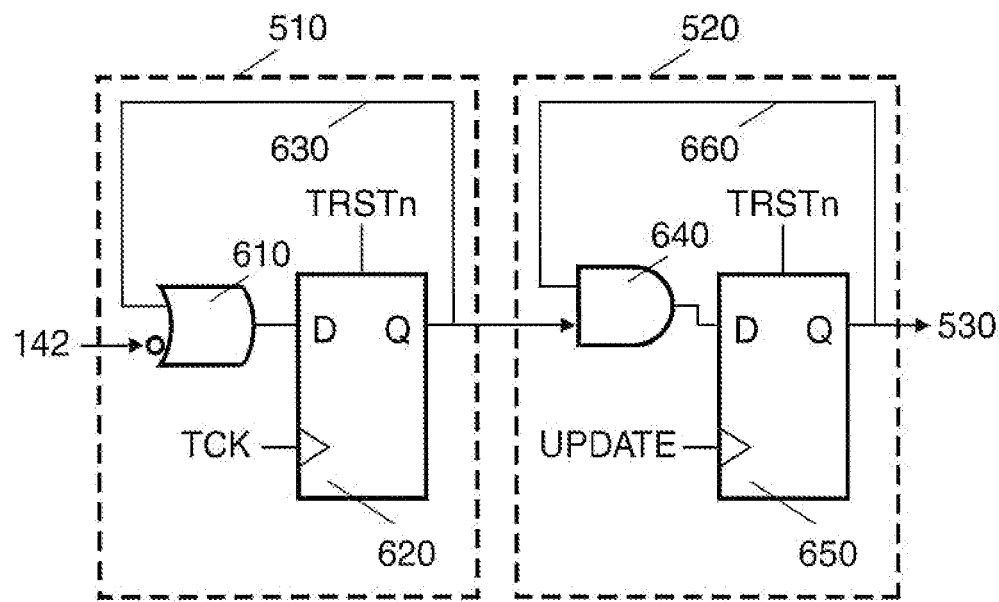

Embodiments of the invention are described in more detail and by way of non-limiting examples with reference to the accompanying drawings, wherein:

FIG. 1 schematically depicts a prior art multi-die device;

FIG. 2 schematically depicts a modified state machine of a die according to an embodiment of the present invention;

FIG. 3a-c schematically depicts the concept of the partial assembly test method according to an embodiment of the present invention;

FIG. 4 schematically depicts a flowchart of an embodiment of the method of the present invention;

FIG. 5 schematically depicts a TDI connection detector according to an embodiment of the present invention; and FIG. 6 schematically depicts a TDI connection detector according to an embodiment of the present invention in more detail.

It should be understood that the Figures are merely schematic and are not drawn to scale. It should also be understood that the same reference numerals are used throughout the Figures to indicate the same or similar parts.

FIG. 1 shows an embodiment of the multi-die device disclosed in WO2007/010493, which can be used to test isolated dies as well as the module as a single device in a JTAG-compliant manner once the assembly of the SiP has been completed. The device 1 is shown to have three dies 100a-c on a carrier (not shown) by way of non-limiting example only. The global structure of the completed multi-chip device of the present invention may be substantially similar to the device shown in FIG. 1, apart from the differences that will be discussed in more detail below.

The device 1 has a number of system interconnects including a device-level TDI 12, a device-level test mode select (TMS) input 14, a device-level test clock (TCK) input 16 and a device-level TDO 18. Each of the IC dies 100a-c shown in FIG. 1 are represented by means of a test arrangement including a test access port (TAP) that each have a TAP controller 110. The TAPs of dies 100a-c may each include a plurality of shift registers, such as a boundary scan or EXTEST register 102, a bypass register 104, an optional identification register 106, which typically carries an identification code of the IC die, and an instruction register 108. Other registers may be present, such as one or more scan chains 122 that are used to feed test patterns into the core logic 120 of the IC die.

The TAPs of dies 100b and 100c further comprise a first multiplexer (MUX) 140 under control of their TAP controller 110 and the TAPs of dies 100a-c comprise a further MUX 150 under control of their TAP controller 110 in response to the contents of instruction register 108 in accordance with the IEEE 1149.1 standard. The first MUX 140 is arranged to receive a primary test data input 142, i.e. the mandatory TDI, and a secondary test data input (STDI) 144 of the die, whereas the further MUX 150 is arranged to output test data via the TDO 152 of the die. The TAP of die 100a does not comprise the MUX 140 because this TAP is the first TAP in the daisy chain of TAPs, and will typically be placed last onto the carrier of the multi-die device 1, which means that TDI 142 will be coupled directly to the device-level TDI 12, and no STDI 144 is required for TAP 110 of die 100a.

Optionally, a signal path 160 is present between the first MUX 140 and the further MUX 150, which bypasses the various shift registers in the test arrangement of the IC die. The signal path 160 is a direct, i.e. unclocked, signal path facilitating fast data transfer through the test arrangement of the IC die, which is particularly advantageous for debug purposes, as is explained in more detail in WO 2007/010493. The TAP controller 110 is responsive to the JTAG mandated TMS signal 112 and the TCK signal 114, which are typically received via respective interconnects of the IC die. The IC die may be responsive to the optional JTAG test reset (TRST) signal, which is also typically provided via an interconnect of the IC die. Alternatively, the TAP controller, or the test arrangement as a whole, may be responsive to an internally generated reset signal from a power-on reset (POR) circuit 130. The POR reset circuit 130 is not an integral part of the present invention and will therefore not be described in any further detail. However, a more detailed description of this circuit can be found in WO 2007/010493.

Every die 100 apart from the first die 100a in a daisy chain of dies of the device 1 has its STDI 144 directly coupled to the device-level TDI 12 via a global conductor 30, thus bypassing previous TAPs in the chain of TAPs of the system-level test arrangement of device 1. However, in an alternative embodiment, the first die 100a also comprises a STDI 144 (not shown) directly coupled to the device level TDI 12. The respective TMS and TCK inputs of TAP controllers 110a-c are all responsive to the device-level TMS input 14 and the device-level TCK input 16 respectively.

The present invention is based on the realization that if the global conductor 30 is already present on a suitable carrier during the assembly of the dies 100 on the carrier, this global conductor 30 may be used to provide test data to a die 100 having a TAP as described above via its secondary input 144. This is however not possible when using the TAP and TAP controller disclosed in WO 2007/010493, as will be explained with the aid of FIG. 2.

FIG. 2 shows a modified version of the IEEE 1149.1 standard compliant state machine on which the TAP controller 110 of WO2007/010493 is based. The conventional parts of the state machine will not be discussed in detail because its operation is well-known in the art. For a detailed description of its operation, the interested reader is referred to the IEEE Standard 1149.1-1990 IEEE Standard Test Access Port and Boundary-Scan Architecture Description, which is available from the IEEE. For the purpose of the present invention, it is sufficient to point out that the JTAG state machine has two main branches: a first branch 210, which controls the communication of data to and from selected data registers (DR) of the TAP, and a second branch 220, which controls the communication of instructions to and from the instruction register (IR) 108 of the TAP. In order for such a state machine to be JTAG compliant, any communication to and from the instruction register must take place via the primary test data input 142, i.e. TDI. This of course makes it impossible to insert instructions into a die of a partially assembled device 1, because the TDI 142 of such a die is not yet connected to the device-level TDI 12.

The TAP controller 110 of a die according to the present invention is modified to enable instructions to be inserted via the STDI 144. To this end, the state machine in FIG. 2 comprises two additional states Shift DR STDI and Shift IR STDI, which are populated in response to a detection mechanism in accordance with the present invention, and in particular when this detection mechanism detects that a precondition for selecting STDI as input e.g. for receiving test instructions for the instruction register 108 has been met. This will now be explained in more detail.

Although inserting instructions via the STDI 144 is not JTAG compliant, it does facilitate testing of dies on a partially assembled device 1. To this end, the TAP controller 110 is configured to select the STDI 144 in response to a reset signal, which may be provided via a device-level TRST input or may be provided by a POR 130.

In a first embodiment, the detection mechanism is based on the recognition of a predefined access or identification code being shifted into one of the data registers of a test access port. To this end, the data register typically comprises decoding logic, which triggers the state machine to switch to Shift IR STDI upon detecting a match between a data pattern received in the data register and its (hard-coded) access or identification code.

After reset, the TAP controller is brought into the Shift-DR state in branch 210. This connects a selected data register to the STDI 144. The selected data register may for instance be the bypass register 104 or the identification register 106. By way of non-limiting example only, the following description assumes that the identification register 106 is selected.

Now, configuration information is shifted into the identification register 106 via the device-level TDI 12 and the global conductor 30. This configuration information has the purpose of notifying the TAP controller that a partial assembly test mode is to be entered, i.e. a test mode in which instructions have to be accepted via the STDI 144. The configuration information is compared with verification data precoded in the TAP controller 110. For instance, the TAP controller 110 may comprise a comparator that compares the received configuration information with the precoded information, e.g. an identification code of the die. In case of a match between the configuration information and the precoded information, the TAP controller 110 assumes an 'STDI-in' mode, in which instructions will be allowed to be received by the TAP 100 via STDI 144. To this end, the TAP controller 110 may comprise a memory element for storing a bit flag indicative of the STDI-in mode. The modifications made to the state machine will be apparent to the person skilled in the art, and are therefore not discussed in any further detail.

It may be advantageous to not immediately activate the STDI-in mode upon decoding the configuration information, for instance to avoid accidental activation of the STDI-in mode. In such a protection mechanism, the state machine may be forwarded to the Pause DR state, and kept in this state for a number of clock cycles matching the bit length of the configuration information. In other words, the Pause DR state is used to rewind a bit counter set by the number of bits received in the Shift DR mode, after which the STDI-in mode is assumed.

Following the activation of the STDI-in mode, the state machine may proceed to the second branch 220, in which test instructions may be fed into the instruction register 108 via STDI 144. The test instructions, e.g. EXTEST, will typically invoke the shifting in of test data via the STDI 144, which can be used to test the die of a partially assembled device 1. After testing the die, the STDI-in mode of the TAP controller has to be disabled again. This may be done in any suitable way, for instance by using a standard reset of five TCK cycles during which the TMS signal is kept at logic high, i.e. TMS=1, or by accessing the TRST pin of the TAP controller 110.

At this point, it is emphasized that the test data provided to a die via STDI may be used to test the internals of the die, or to test its environment, e.g. in EXTEST mode.

In an alternative embodiment, the TAP controller 110 comprises an additional test data selection input for providing configuration information in the form of an STDI-in mode selection signal. In this embodiment, no comparison hardware is required, nor does the state machine have to step through the Shift DR and Pause DR states as previously described. However, because additional inputs, i.e. additional pads, are usually unwanted because of cost implications, or more often than not unfeasible because of pad-hungry designs, this embodiment is not preferred.

FIG. 3a-c and FIG. 4 describe an embodiment of the partial assembly test method of the present invention in more detail. The method starts in a step 410 in which a carrier 300 with routing is provided. The routing typically comprises the global conductor 30 and the test connections for the dies to be placed on the carrier 300, such as TMS conductor 14 and TCK conductor 16. The routing may further include functional die interconnections. These have not been shown in FIG. 3a for reasons of clarity only. In FIG. 3a, carrier 300 comprises a number of regions 320 that are to receive respective dies in the assembly process of the device 1.

In a next step 420, a first die 100c is placed on the carrier and connected to the routing. This is shown in FIG. 3b. The assembly process of the device 1 typically implements a daisy chain of dies 100 in reverse order, i.e. the final die of the daisy chain to be formed is placed first on the carrier 300. As explained previously, the first placed die may be the cheapest die or the die most likely to be faulty. The first die 100c has its TDO 152 connected to device-level TDO 18, and its STDI 144 connected to global conductor 30, which connects STDI 144 to the device-level TDI 12. At this stage of the assembly process, TDI 142 remains unconnected.

In a next step 430, the first die 100c is brought into its STDI-in mode as described in the detailed description of FIG. 2, and subsequently tested via STDI 144, with the test result being made available of device-level TDO 18 via TDO 152 of the first die 100c. In step 440, the test result is evaluated and decided if the first die 100c is fault-free. If the first die 100c is faulty, the method of the present invention may proceed to step 450 in which the decision is taken whether or not to repair the partial assembly. Repairing the assembly may include replacing or repairing the die 100c, after which the die 100c will be retested, as indicated by the method reverting to step 430. If the partial assembly is not repaired, for instance because repairs are either impossible or too time consuming and/or costly, the partial assembly will be discarded in step 480 after which the method will end in step 490.

If the partial assembly is successfully repaired, or if the die 100c was tested to be fault-free, the method may proceed to step 470 in which it is decided if the assembly is complete. If not, the method reverts back to step 420, and the next die 100b of the daisy chain of dies to be formed is placed on the carrier 300, as shown in FIG. 3c. The STDI of the next die 100b is connected to the global conductor 30 and TDO of the next die 100b is connected to the previously unconnected TDI 142 of the previously placed die 100c, thus forming a daisy chain of two dies. The TMS and TCK inputs of the die are connected to the device-level TMS conductor 14 and TCK conductor 16 respectively. Note that at this point, the TDI 142 of the next die 100b is not yet connected. The die 100b is brought in its STDI-in mode as previously explained and subsequently tested via STDI 144, with the test result being made available on the device-level TDO 18 via the TAP daisy chain formed by dies 100b and 100c.

This process may be repeated until all dies have been placed onto the carrier 300. It is pointed out that the last die to be placed, i.e. the first die of the daisy chain of dies between the device-level TDI 12 and the device-level TDI 18 does not need to have a secondary test data input 144 because its primary test data input 142 will be connected directly to the device-level TDI 12. Hence, the finally placed die may be tested in a JTAG-compliant manner. Hence, the finally placed die does not need to have a modified state machine. After placement of the final die, a device 1 is obtained that may be tested in a JTAG compliant manner in accordance with the teachings of WO2007/010493.

It is furthermore pointed out that the present invention is not limited to the placement of dies one at a time. More than one die may be simultaneously placed, for instance when some of the dies to be placed are incapable of receiving instructions via an additional STDI 144. Such dies are placed as 'successor' dies in the daisy chain, such that their TDI 142 is connected to a TDO 152 of a predecessor die. As long as the first die, i.e. the die having an unconnected TDI 142 can be accessed in accordance with the method of the present invention, its successor dies may be tested in a conventional manner, i.e. by providing test data through the TDO-TDI daisy chain.

It is further observed for clarity that the terms 'placing', 'mounting' and 'assembling' are herein used as equivalents for any assembly process, including mounting of a die to a carrier and subsequent communicatively coupling by means of wirebonding or tape-automated bonding or the like flip-chip assembly of a die to a carrier resulting in the communicatively coupling mounting of a die inside a carrier such as a printed circuit board, to obtain a "chip-in-board"-assembly.

It is further observed that the dies may be assembled directly to the carrier or alternatively to one of the other dies. The carrier is suitably any carrier typically in use in packaging such as for example a printed circuit board, a ceramic substrate, a silicon interposer and a leadframe. The carrier may include additional functionality such as passive components but does not need to.

It is moreover pointed out that the assembly and testing are suitably combined in one method, but that is not strictly necessary. E.g. a customer could test the partially assembly provided by its supplier, prior to further assembly steps.

It will be appreciated that the method of the present invention facilitates the testing of individual dies on partially assembled multi-die devices such as a SiP using well-established JTAG test techniques. This enables fast and reliable testing of dies on such a partial assembly, thus facilitating the detection of faults in the earliest possible stage of the assembly process, thereby increasing reparability and reducing yield losses.

The configuration information to activate the STDI-in mode of a die is typically made available to the builders of the device 1. This facilitates these builders to individually test dies from different sources, provided that each of these sources provides a die in accordance with the teachings of the present invention.

A preferred embodiment of a detection mechanism in accordance with the present invention is shown in FIG. 5. This embodiment is based on the realization that the primary TDI 142 typically is connected to a fixed binary value source such as a pull-up voltage source, e.g. a pull-up transistor in case of the IEEE 1149.1 standard to ensure that the input does not exhibit floating behavior during functional mode of the device 1. For this reason, the IEEE 1149.1 standard mandates that certain data patterns, e.g. an identification code or a bypass bit, must include at least one binary complement of the fixed binary source, e.g. a logic '0' in case of the IEEE 1149.1 standard. However, an implementation where TDI 142 is connected to a pull-down voltage source is equally feasible from a technical perspective.

To this end, a TDI connection detector 510 is connected to the TDI 142 for detecting the logical complement on TDI 142. As soon as such a logical complement has been detected, this is an indication that the TDI 142 has been connected to a data driving source, e.g. a TDO 152 of a predecessor die, because the fixed binary value source has been overridden by a complementary data value received on the TDI 142. The detector 510 is coupled to MUX 140 via logic gate 530, which combines the detection signal with the MUX control signal generated by TAP controller 510 such that when the detector 510 has failed to detect a logical complement during a detection phase, thereby indicating TDI 142 being unconnected to a predecessor die, the logic gate 530 will force the MUX 140 to accept data from STDI 144.

For instance, after a reset of a die, it is defined in the IEEE 1149.1 standard that a disconnected TDI 142 will be read as a '1' due to the weak pull-up transistor connected to this input. It is also known that if the TDI 142 is connected to a preceding die, it will shift in a '0' from the BYPASS register of the preceding die, or it will start shifting in the ID code from the preceding die. The ID code starts with a '1', followed by the JEDEC code of the die, which consists of 11 bits, with an all '1' code being illegal in the standard. Hence, it is guaranteed that after shifting the selected data register at least 12 times (SHIFT DR in FIG. 2), a binary complement, i.e. a logic '0', must have shifted into the TAP via the TDI 142.

The same will be true after a reset coming from the test-logic-reset state (see FIG. 2), after which the first action will be an instruction shift (SHIFT IR in FIG. 2). During this first instruction shift, as defined by the standard, a leading '1' must be followed by a '0', after which the remaining bit content of the initial instruction register will be received from the predecessor TDO 152. In this case, the connection of TDI 142 will be detected within just two shift cycles.

At this point, it will be appreciated that an unconnected TDI 142 will not produce a binary complement of its weakly fixed value, e.g. a logic '0' in case of an IEEE 1149.1 compliant test arrangement, thus causing the output of the TDI connection detector 510 to remain the binary complement of this fixed value, e.g. a logic '0', thus indicating the disconnected state of the TDI 142. However, in this state, the TDI connection detector 510 is still sensitive to changes on TDI 142, which may occur during further testing of the die, e.g. in case of a designer forcing a logic low onto the unconnected TDI 142 by means of an external probe. In such a scenario, the TDI connection detector 510 should not be able to influence the state of the MUX 140 after the initial detection period.

Therefore, it may be advantageous to limit the active detection of the connection state of TDI 142 to a limited period. To this end, the detection circuit 500 may further comprise a first update detector 520, which ensures that as soon as a first update signal (e.g. UPDATE DR or UPDATE IR in FIG. 2) following a reset is detected, the output of the detection circuit 500 is fixed regardless of changes in the voltage on TDI 142. The first update detector 520 coupled between the detector 510 and the logic gate 530. The first update detector 520 is responsive to any update signal generated by the TAP controller 110, and ensures that a fixed signal is produced on its output after having received the first update signal from the TAP controller 110.

FIG. 6 shows a possible embodiment of the detection circuit 500 in more detail. The TDI connection detector 510 comprises a sequential element 620, e.g. an edge-triggered or other type of flip-flop, which is controlled by the test clock TCK and has its data input D connected to TDI 142 via an OR gate 610. The OR gate 610 received TDI 142 on an inverted input. The output of the sequential element 620 is fed back to the other input of the OR gate 610 via feedback path 630. Hence, as soon as a logic '0' is detected on TDI 142, which is indicative of a connection between TDI 142 and a predecessor TDO 152, the inverted input of the OR gate 610 will detect a logic '1', thus producing a logic '1' at its output, which is clocked into the sequential element 620 in the next cycle of TCK. The feedback path 630 ensures that the logic '1' on output Q of the sequential element 620 is continuously provided to OR gate 610, thereby locking the OR gate 610 and the sequential element 620 into a stable state until the sequential element 620 is reset by a reset signal such as TRSTn, which causes the sequential element to initialize into a logic '0' state.

The first update detector 520 a sequential element 650, e.g. an edge-triggered or other type of flip-flop, which is controlled by an update signal UPDATE from the TAP controller 110 and has its data input D connected to TDI connection detector 510 via an AND gate 640. The output of the sequential element 650 is fed back to the other input of the AND gate 610 via feedback path 660. The sequential element 650 is arranged to initialize to a logic '1' upon reset, e.g. with reset signal TRSTn. Hence, when an unconnected TDI is signaled by the TDI input detector 510 by means of a logic '0' on its output, AND gate 640 will produce a logic '0' on its output, which will be clocked into the sequential element 650 of the update detector 520 upon the first update signal produced by the TAP controller 110. It will be apparent that the feedback path 660 feeds back the logic '0' in the sequential element 650 to the AND gate 640, thereby locking the update detector 520 to produce a logic '0' since the AND gate 640 has become insensitive to any variations on its input from TDI detector 510 until the detection circuit 500 is reset.

The TDI connection detector 510 can be also be used to ensure testability of a multi-die device in which it is unfeasible to connect both TDI 142 as well as STDI 144 of the first die 100a to the die-level TDI 12, for instance because the pin lead of TDI 12 is incapable of supporting two bond wires, i.e. to both TDI 142 and STDI 144 of die 100a. In scenarios where only STDI 144 of the first die 100a is connected to the die-level TDI 12, the TDI connection detector 510 ensures that the whole multi-die device can still be tested despite TDI 142 of the first die 100a being disconnected, because the TDI connection detector 510 of die 100a will ensure that STDI 144 of die 100a is selected for forwarding data to successor dies 100b, 100c in the daisy chain of dies.

It is pointed out that alternative ways of controlling the MUX 140 are also feasible. For instance, the MUX control signal may be influenced in the same manner by the aforementioned decoding logic in case of a positive match between the encoded identifier and a received data pattern. This means that the data pattern recognition has the same initial effect as the TDI connection detector 510. In this case, the comparator signal from the decoding logic should be handled by a one-time detector similar to the update detector 520. In case of a non-addressed die, the gating of the MUX 140 by the decoding logic does not occur, and the TAP controller 110 remains in control of the MUX 140.

After the first update signal, the MUX 140 will be stable until reset, e.g. JTAG reset, or when explicitly changed by private instructions, as explained earlier.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of testing a partially assembled multi-die device said device comprising:
    a carrier comprising a device-level test data input and a device-level test data output; and
    a first die on the carrier, the first die having a test access port comprising a primary test data input, a secondary test data input and a test data output, the test access port being controlled by a test access port controller; wherein the secondary test data input of the first die is communicatively coupled to the device-level test data input, and the test data output of the first die is communicatively coupled to the device-level test data output;

which method comprises the steps of:
  bringing the first die into a state in which the first die accepts test instructions from its secondary test data input;
  providing test data to the first die, including providing the secondary test data input of the first die with test instructions through the device-level test data input; and
  collecting a test result from the first die on the device-level test data output.

2. A method as claimed in claim 1, wherein the step bringing the first die into a state comprises providing a selected register of the first die with configuration information to bring the first die in said state.

3. A method as claimed in claim 2, wherein the selected register comprises an identification register coupled between the secondary test data input and the test data output of the first die, the first die further comprising comparison logic coupled to the identification register, and wherein the step of bringing the first die in a state in which the first die accepts test instructions from its secondary test data input comprises:
  resetting the test access port controller of the first die such that the identification register is coupled to the secondary test data input;
  shifting the configuration information into the identification register via the device-level test data input;
  comparing the provided configuration information with an identification code stored in the first die; and
  enabling the test access port to receive test instructions via the secondary test data input in case of a match between the configuration information and the identification code.

4. A method as claimed in claim 1, wherein the test access port controller comprises a test input selection pin, the method further comprising connecting the test input selection pin to a carrier-level configuration input and wherein the step of bringing the first die into said state comprises providing the test input selection pin with a secondary test input selection signal.

5. A method as claimed in claim 1, wherein the primary test data input pin is connected to a weak fixed binary value source, and the first die comprises a detector for detecting the binary complement on the primary test data input, and wherein the step of bringing the first die into said state comprising selecting the secondary test data input in response to the detector signaling the absence of the binary complement on the primary test data input.

6. A method as claimed in claim 1, wherein the method comprises following assembly steps to form the partially assembled multi-die device:
  providing a carrier comprising a device-level test data input and a device-level test data output;
  assembling a first die to the carrier, the first die having a test access port comprising a primary test data input, a secondary test data input and a test data output, the test access port being controlled by a test access port controller, said assembling step including to communicatively coupling the secondary test data input of the first die to the device-level test data input, and the test data output of the first die to the device-level test data output.

7. An integrated circuit die comprising a test arrangement, the test arrangement comprising:
  a test access port comprising a primary test data input, a secondary test data input and a test data output;
  a multiplexer having respective inputs coupled to the primary test data input and the secondary test data input;
  a plurality of registers including an instruction register, said plurality of registers being coupled between the multiplexer and the test data output detection means for detecting a precondition for receiving test instructions via the secondary test data input; and
  a test access port controller for coupling the instruction register to the secondary test data input in response to the detection means.

8. An integrated circuit as claimed in claim 7, wherein the detection means comprise comparison logic coupled to a data register of the test access port.

9. An integrated circuit as claimed in claim 8, wherein the data register is an identification register, and wherein the test access port is arranged:
  to couple the identification register to the secondary test data input in response to a reset signal; and
  to couple the instruction register to the secondary test data input in response to the detection of configuration information in the identification register by the comparison logic.

10. An integrated circuit die as claimed in claim 7, wherein the instruction register comprises a register cell for storing a bit flag indicating the selection of the primary test data input, the multiplexer being responsive to the bit flag.

11. An integrated circuit as claimed in claim 7, wherein the detection means are comprised by the test access port controller, the detection means comprising a test data input selection pin responsive to test data input selection information, the test access port controller being coupled to the test data input selection pin.

12. An integrated circuit as claimed in claim 7, wherein the primary test data input is connected to a weak fixed binary value source, and the detection means comprise a detector for detecting the binary complement on the primary test data input.

13. An integrated circuit as claimed in claim 12, wherein the detector comprises an input coupled to the primary test data input and an output coupled to a further detector for detecting a first instance of an test access port controller update signal, the further detector having an output coupled to a logic gate further arranged to receive a multiplexer configuration signal from the test access port controller, the multiplexer being responsive to the logic gate.

14. A partially assembled multi-die device comprising:
  a carrier with a device-level test data input and a device-level test data output, and
  a first integrated circuit die as claimed in claim 7 assembled to the carrier, wherein the secondary test data input of the first die is communicatively coupled to the device-level test data input (12), and the test data output of the first die is communicatively coupled to the device-level test data output.

15. A multi-die device comprising:
  a device-level test data input;
  a device-level test data output; and
  a plurality of integrated circuit dies organized in a daisy chain between the device-level test data input and the device-level test data output, said plurality of integrated circuit dies comprising at least one integrated circuit die according to claim 7.

* * * * *